United States Patent [19]

Fruen, Jr.

[11] Patent Number: 5,260,514
[45] Date of Patent: Nov. 9, 1993

[54] WIRE BONDER AND VACUUM PEDESTAL WORKHOLDER FOR SAME

[75] Inventor: William J. Fruen, Jr., Santa Clara, Calif.

[73] Assignee: LSI Logic Corporation, Milpitas, Calif.

[21] Appl. No.: 843,486

[22] Filed: Feb. 28, 1992

[51] Int. Cl.⁵ .................. B23K 37/00; H01L 23/02; H01R 13/60
[52] U.S. Cl. .................. 174/52.4; 439/41; 439/42; 228/4.5; 257/697
[58] Field of Search ............. 174/52.4; 257/692, 693, 257/697; 361/417, 418, 419, 420; 439/50, 55, 59, 74, 75, 41, 42; 206/328, 329; 437/209, 214, 215, 216; 228/4.1, 4.5

[56] References Cited

U.S. PATENT DOCUMENTS

| | | | |
|---|---|---|---|
| 4,759,073 | 7/1988 | Shah et al. | 228/4.5 |
| 4,762,267 | 8/1988 | Shimizu | 228/4.5 |
| 4,818,238 | 4/1989 | Borg | 439/42 |
| 5,000,697 | 3/1991 | Murphy | 439/331 |

Primary Examiner—Leo P. Picard
Assistant Examiner—Bot Ledynh
Attorney, Agent, or Firm—Gerald E. Linden; Michael D. Rostoker

[57] ABSTRACT

A fully-populated Pin Grid Array (PGA) is vacuum-chucked to a pedestal, without mechanical clamping. The pedestal includes a cylindrical shaft having a vacuum passageway extending its length, and a vacuum reservoir block mounted atop the shaft, and an alignment/fixture plate mounted atop the vacuum reservoir block. The alignment/fixture plate is provided with holes extending partially through the plate, at least about its periphery, for receiving the outermost rows/columns of pins of the PGA, while maintaining a vacuum seal. In one embodiment, a central portion of the alignment/fixture plate is provided with a large through-opening for receiving the remaining pins of the PGA. In another embodiment, the central portion of the alignment/fixture plate is provided with a plurality of individual through holes corresponding to the remaining pins of the PGA. In this manner, the PGA is held securely and well aligned within a wire bonder, while avoiding damaging the pins.

8 Claims, 4 Drawing Sheets

WIRE BONDER AND VACUUM PEDESTAL WORKHOLDER FOR SAME

TECHNICAL FIELD OF THE INVENTION

The invention relates to the packaging of integrated circuit (IC) semiconductor devices, and more particularly to techniques for connecting (wire bonding) semiconductor die pads to package terminals, especially those of a "fully-populated" Pin Grid Array (PGA).

BACKGROUND OF THE INVENTION

Wire bonding involves connecting the pads of a semiconductor die to the terminals of a package with a fine (on the order of 0.00125 inch) wire. One common wire bonding technique is referred to as "aluminum wedge bonding". A suitable apparatus for performing such bonding is bonder part number SWB-FA-US-30, available from Shinkawa Corporation of Japan.

A die mounted in an open package is supported on a pedestal, and an automated wire bonder performs the necessary connections between die "pads" and package "terminals", according to pre-programmed instructions. The pedestal is mounted on a rotary table, which rotates the die/package to any of a number of angular positions (azimuths). Hence, the die/package must be securely mounted to the pedestal during the wire-bonding process, and its position relative to the bond tool must be relatively un-ambiguous. A mechanism for raising the die/package off of a carrier to a predetermined height for bonding ("bonding level") may also be included in the wire bonding equipment. The bonding equipment may also include optical equipment for monitoring and controlling the bonding process, such as by locating "target" patterns disposed on the die and package.

Usually the die is square, and is provided with bond pads about its entire outer periphery. Likewise, the package is usually square, and is provided with a corresponding number of terminals about the entire inner periphery of a central opening. A bonding tool, typically including a wedge, places one end of a bond wire in contact with the pad (e.g.) to be bonded, and ultrasonic energy effects bonding of the wire to the pad. The bonding tool then lifts, moves, then lowers itself to another location, and bonds another end of the wire to a package terminal (e.g.). In order to position the bonding tool at various locations in the plane of the die/package, either the rotary table is indexed about its axis, or the bonding tool itself is able to move in an X-Y direction, or both. Evidently, to cover the entire range of pad/terminal connections, it is necessary to rotationally reposition the die/package between bonds.

During the bonding operation, it is necessary to retain the die/package securely upon the pedestal. This is usually accomplished with mechanical clamps, which hold the package to the pedestal. Although mechanical clamping arrangements hold the package securely in place, the have some drawbacks. First, they take up space—usually extending beyond the outer periphery of the package—often interfering with rotational positioning of the die/package (i.e., the clamps bump into other parts of the wire bonder). Second, the clamps themselves have non-trivial mass, which increases the rotational inertia and momentum of the pedestal/die/package. This complicates rotational positioning of the die/package, which may occur at a rate of on the order of one degree per 20 milliseconds.

A common type of semiconductor device assembly has a plurality of pins exiting the bottom surface of the package body, and is termed a Pin Grid Array (PGA). The present invention is especially applicable to PGAs.

The complexity of modern semiconductor devices results in a high number of pins. Pin counts in excess of one hundred are not uncommon. For high pin count packages, the pins are necessarily very thin and closely spaced. Spacing on the order of 0.070–0.100 inch (center-to-center) is not uncommon. Evidently, these pins are delicate, and caution must be exercised in handling the package to avoid damaging the pins so that they can be properly aligned with corresponding holes in a printed wiring board (e.g.) or in a socket to which the packaged device is ultimately mounted. Common damage modes include: 1) physical distortion of the leads, or 2) removal of plating from the leads due to scraping (the leads are commonly gold-plated). Damage to the package body itself, typically a layered ceramic structure, is also a concern.

For PGAs having a plurality of pins extending from the underside of the package, mechanical clamping devices can cause pin damage. Pins are commonly plated (e.g., gold) over base metal (e.g., copper). Pin damage modes include bending of pins, which makes subsequent insertion into a socket of printed wiring board difficult, and scraping the plating, which may mean a "reject" part (e.g., in military specification parts).

One approach to securing the package to the pedestal of a wire bonder, for bonding PGAs, is mounting a cam-actuated test socket to the pedestal, inserting the package, and clamping the pins. This mechanical arrangement, which depends on clamping the pins, can also lead to plating defects and consequent rejection of parts.

Regarding PGAs, for purposes of this discussion there are basically two types: fully-populated and partially-populated. A "fully-populated" pin grid array has pins extending in a number of columns and rows (an array) from substantially the entire undersurface of the package. A "partially-populated" pin grid array also has an array of pins, but has an area clear of pins in a central region of the underside of the package. Evidently, a fully populated PGA can have more pins than a partially populated PGA, for a given size package—all other factors being equal.

In the process of packaging a semiconductor device in a PGA package, it is typical that the semiconductor die is inserted into an opening in the top surface of the package. The package already has pins exiting the bottom surface of the package body, and lead fingers (or "terminals") within the opening in the package body. The lead fingers (terminals) are internally connected to the pins. After the die pads are connected to the lead fingers (such as by wire or tape-automated bonding), a lid is applied over the package opening to seal the device within the package. During these packaging steps, there are many opportunities for causing damage to the pins and/or package while handling and processing the package.

FIG. 1 shows a typical PGA-type semiconductor device assembly 100, for which the present invention is especially pertinent. The assembly includes a square, flat ceramic package body 102 having a top surface 102a and a bottom surface 102b. An opening 104 extends into the top surface of the package. A plurality of pins 106 extend outward from the bottom surface 102b, and are connected (not shown) to terminals (lead fingers, in the case of wire bonding, or bond sites, in the case of TAB bonding) 108 which extend to within the opening. This type of package is referred to as a Pin Grid Array (PGA).

A semiconductor die 114 is inserted into the opening 104, is physically attached (usually adhered) by its back surface 114b to a die attach pad (not shown), and is connected to the exposed ends of the lead fingers 108 by any suitable technique (e.g., wire bonding or tape automated bonding). The die 114 has a front surface 114a containing circuitry (not shown) and conductive pads 120 for input/output connection to the circuitry.

In many cases, selected pins 106, for example one pin at each of the four corners of the package 102, are provided with expanded "stops" 106a spaced from the bottom 102b of the package body 102, so that the package body 102 will sit a prescribed distance above a printed wiring board (not shown) to which the assembly 100 is mounted. For purposes of this discussion, pins 106 having stops 106a are termed "guide pins".

The top surface 102a of the package is has a metallic ring 110 formed about the periphery of the opening 104. After the semiconductor device 114 is electrically connected to the lead fingers (terminals) 108, a lid 116 is secured over the opening 104, "capping" the package. The lid is essentially a flat metal plate, and is evidently slightly larger than the opening 104. The lid is commonly sized to fit over the ring 110. A solder "preform" foil 118, of similar size and shape as the ring 110 is provided between the lid 116 and the ring 110, so that the lid may be secured to the package body 102 simply by heating the entire assembly, causing the preform 118 to seal and secure the lid 116 to the top surface of the package 102, over the opening 104.

Typically, a central area (not shown) on the bottom surface 102b of the package 102 is free of pins, in an area corresponding roughly to the opening 104. This arrangement is known as a "partially-populated" PGA.

FIG. 2 is a view of the PGA 100 of FIG. 1, after wire bonding (prior to assembly of the lid 116 and preform 118). As shown, fine bond wires 122 connect the pads 120 of the die 114 to the terminals 108 of the package 102.

FIG. 3 is a cross-sectional view of a partially-populated PGA, vacuum-chucked to a pedestal. For purposes of this illustration, the opening 104, die 114, bond wires 122 and preform 118 are omitted, for illustrative clarity. Further, this is a "near-sighted" cross section, in that an area 124 clear (void) of pins on the underside 102b of the package 102 is shown without any pins, and the pins 106 behind the clear area 124 are not illustrated. As shown, the package 102 rests atop a pedestal 200. The pedestal 200 has a top surface 202 upon which the clear area 124 of the package rests. The pedestal has an air passage 204 extending from the top surface 202, through the pedestal 200, to a suitable vacuum source 206. In this manner, the package is held reasonably firmly on the pedestal 200. However, there is evidently no easy way to precisely locate the package on the pedestal 200.

Precisely locating the package body on the pedestal is very important in the manufacturing process. It is important that the wire bonder be able to "find" the die pads and package terminals.

It has also been known to vacuum chuck non-pinned packages, in other words packages having leads extending generally in-plane from their side edges, rather than pins extending down from their bottom surface.

While target areas may be imprinted on the die and package, allowing an operator to precisely locate the package and die, such searching takes productive time away from actual bonding. Evidently, resolvers and encoders in the rotary table, or the like, supporting the pedestal, allow the bonder to locate the pedestal with great precision. It is somewhat antithetical that a vacuum chuck, such as is illustrated in FIG. 3, lacks the same precision. It would be preferable not only that a die/package is reasonably precisely located by pedestal, however it may be supported thereby, but also that the location of a die/package mounted to a pedestal is repeatable from package to package in a production operation.

The vacuum-pedestal arrangement shown in FIG. 3 is entirely not suitable for fully-populated PGAs, which do not have a clear area (see 124, FIG. 3) for resting upon the vacuum pedestal. Nor does the vacuum pedestal of FIG. 3 hold the package extremely securely, in that it acts upon only a small central area (124) of the package. Relying entirely on suction and friction, it is possible that the package and die will shift under the torque of rotation, using the vacuum pedestal of FIG. 3. Also, as mentioned above, a vacuum chuck holding the bare undersurface of a package does not provide for good alignment of the package in the bonder.

DISCLOSURE OF THE INVENTION

It is therefore an object of the present invention to provide an improved technique for wire bonding a die to a package.

It is another object of the present invention to provide an improved technique for wire bonding fully-populated PGAs.

It is another object of the present invention to provide a bonding technique that eliminates the need for mechanical clamping devices for wire bonding.

It is another object of the present invention to provide a bonding technique that reduces the rotational inertia/momentum of a wire bonding pedestal.

It is another object of the present invention to provide a technique for holding a PGA package reasonably well aligned in a wire bonder while avoiding the possibility of damaging the pins.

It is another object of the present invention to provide a non-mechanical method of holding a PGA in a wire bonder, while rotating the package, without allowing the package to shift its rotational position with respect to a pedestal.

It is another object of the present invention to provide a semiconductor device assembly manufactured according to the technique of the present invention.

According to the invention, a wire bonder includes a pedestal, upon which is supported a package and die to be bonded. The pedestal includes a generally cylindrical shaft with an air passageway extending through the shaft. A vacuum reservoir block is disposed atop the shaft, and is approximately at least as big as a semiconductor package to be supported. An alignment/fixture plate is disposed atop the vacuum reservoir block, and is provided with a plurality of holes for receiving the pins of a PGA.

According to one embodiment of the invention, the alignment/fixture plate is provided with a complete array or holes corresponding to the array (columns and rows) of pins on the PGA. In this embodiment, the outer few (one, two or more) rows and columns of holes preferably do not extend completely through the plate (they extend into the plate from its front surface), but the inner rows and columns of holes extend completely through the plate (from its front to back surfaces). The vacuum reservoir block is provided with a cavity communicating with the holes extending through the alignment/fixture plate. In this manner, vacuum applied to the air passageway of the shaft causes a package body to be firmly retained on the top (exposed) surface of the alignment/fixture plate, and the semiconductor package body is supported substantially by its entire bottom surface.

According to an aspect of the first embodiment of the invention, a few of the holes in the alignment/fixture plate are oversize, to allow for easy insertion of a standoff pin (106a) into the plate; a few of the holes are undersize, having a close tolerance with selected pins and thus maintaining the package body precisely located with respect to the pedestal (and hence, with the wire bonder); and the remaining majority of holes are sized for easy insertion of pins.

According to an alternate embodiment of the invention, the alignment/fixture plate is provided with only a few rows and columns of pin-receiving holes, corresponding to the outermost columns and rows of pins on a package and not extending through the plate. The pin-receiving holes do not extend completely through the plate. A large central portion of the plate, within the region having pin-receiving holes, has a large opening extending completely through the plate. In this manner, vacuum applied to the air passageway of the shaft causes a package body to be firmly retained on the top (exposed) surface of the alignment/fixture plate, and the semiconductor package body is supported substantially by its entire bottom surface.

Other objects, features and advantages of the invention will become apparent in light of the following description thereof.

BRIEF DESCRIPTION OF THE DRAWINGS

FIG. 1 is also representative of a method of assembling a semiconductor die in a PGA.

DETAILED DESCRIPTION OF THE INVENTION

Figure 1:
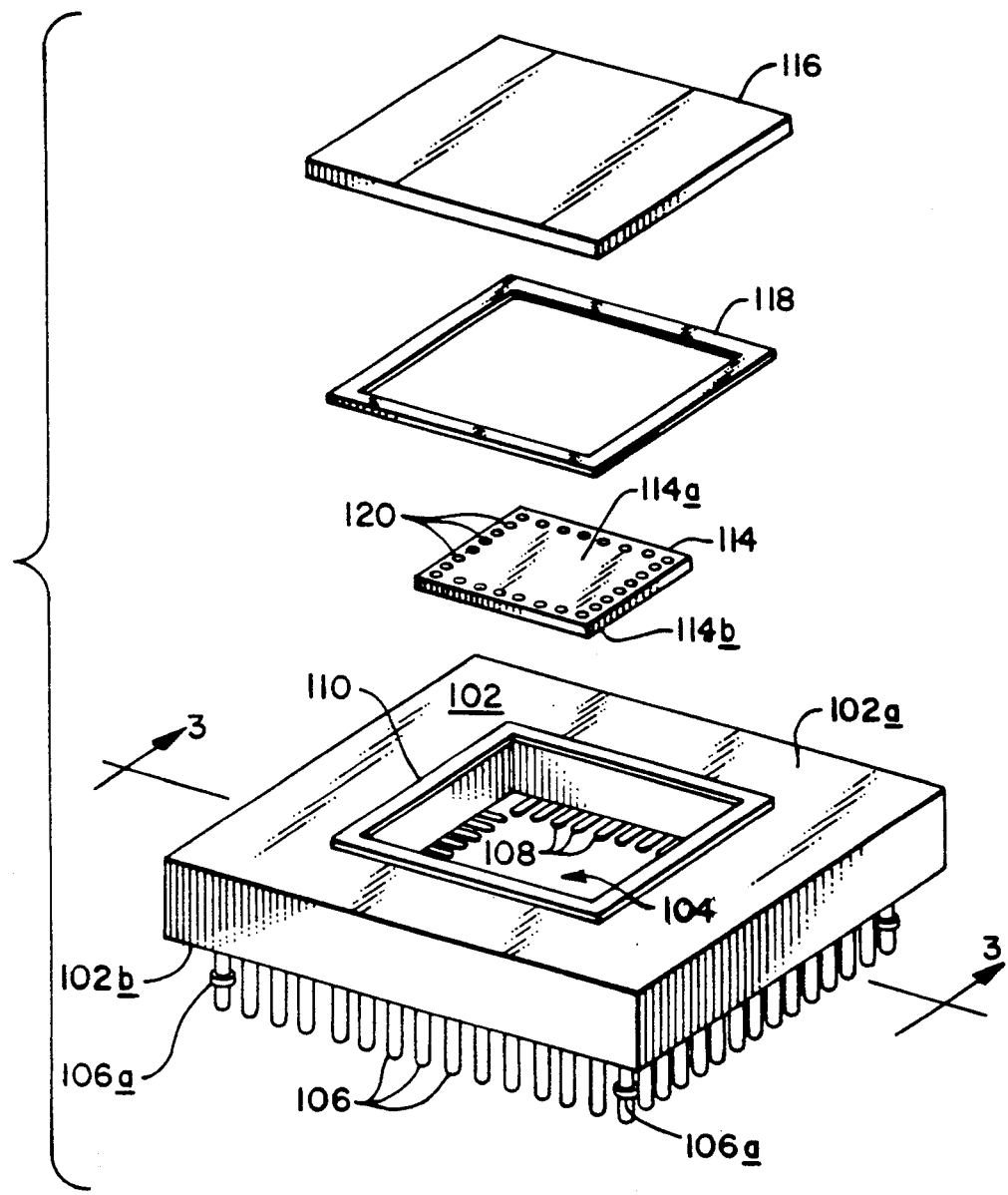
FIG. 1 is an exploded perspective view of a prior art Pin Grid Array (PGA), and is representative of either a "fully-" or "partially-" populated PGA.

FIG. 1 shows a typical Pin Grid Array (PGA) type semiconductor package 102, for enclosing a semiconductor die 114. The package has internal terminals 108, and the die has pads 120. The pads are wire-bonded to the terminals. The PGA 100 illustrated in FIG. 1 is illustrative of either a "fully-" or "partially-" populated PGA, and is discussed in greater detail hereinabove.

Figure 2:
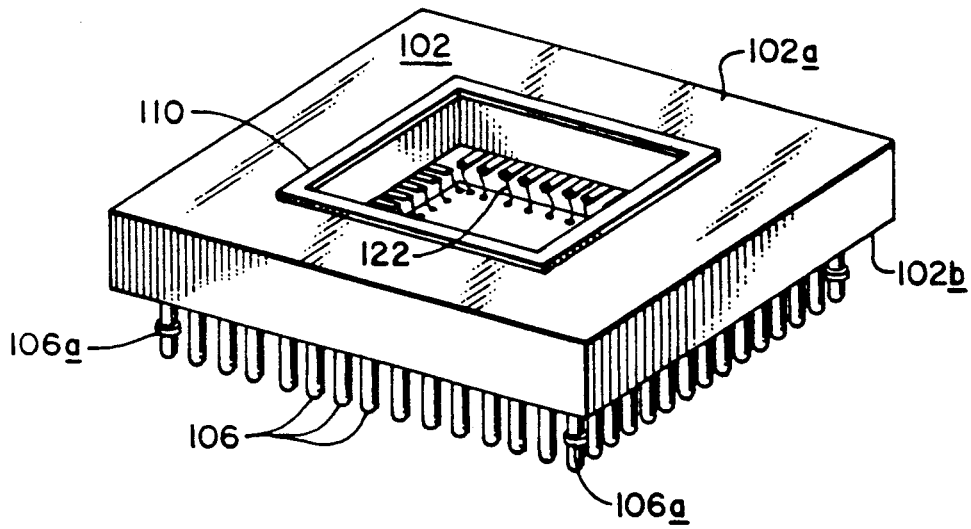
FIG. 2 is a perspective view of the PGA of FIG. 1, partially assembled.

FIG. 2 shows the PGA 100 of FIG. 1, partially assembled, with wires 122 connecting the pads 120 to the terminals 108, and is discussed in greater detail hereinabove.

Figure 3:
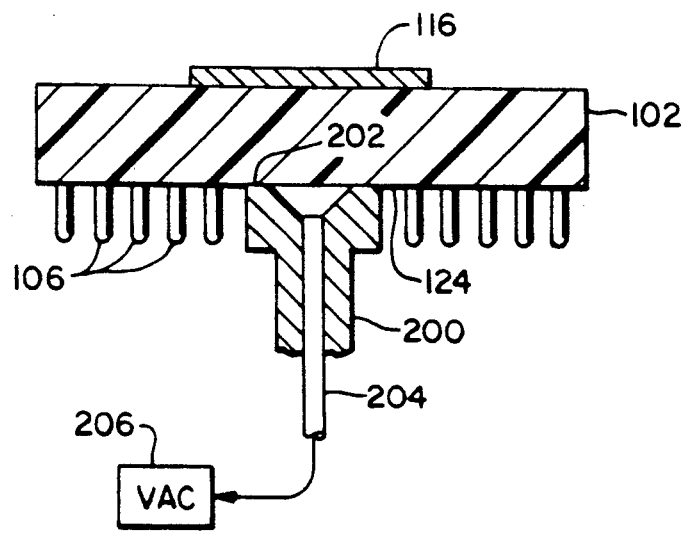
FIG. 3 is a cross-sectional view of the PGA of FIG. 1 (specifically, a partially-populated version of the PGA), supported atop a vacuum chuck, according to the prior art.

FIG. 3 shows a partially-populated version of a PGA (see, e.g., 100 of FIG. 1), resting atop a vacuum chuck pedestal 200, and has been discussed in greater detail hereinabove.

As noted hereinabove, neither mechanical clamping nor the vacuum pedestal technique of FIG. 3 are suitable for holding a fully-populated PGA in place during wire bonding.

Figure 4B:
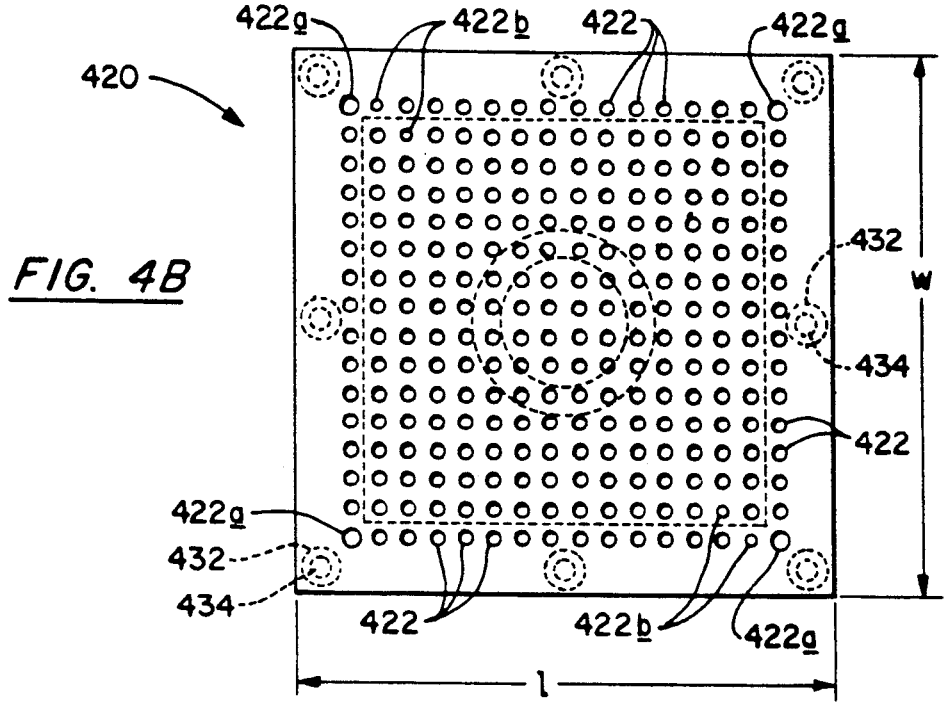
FIG. 4B is a top plan view of the vacuum pedestal of FIG. 4A.
Figure 4A:
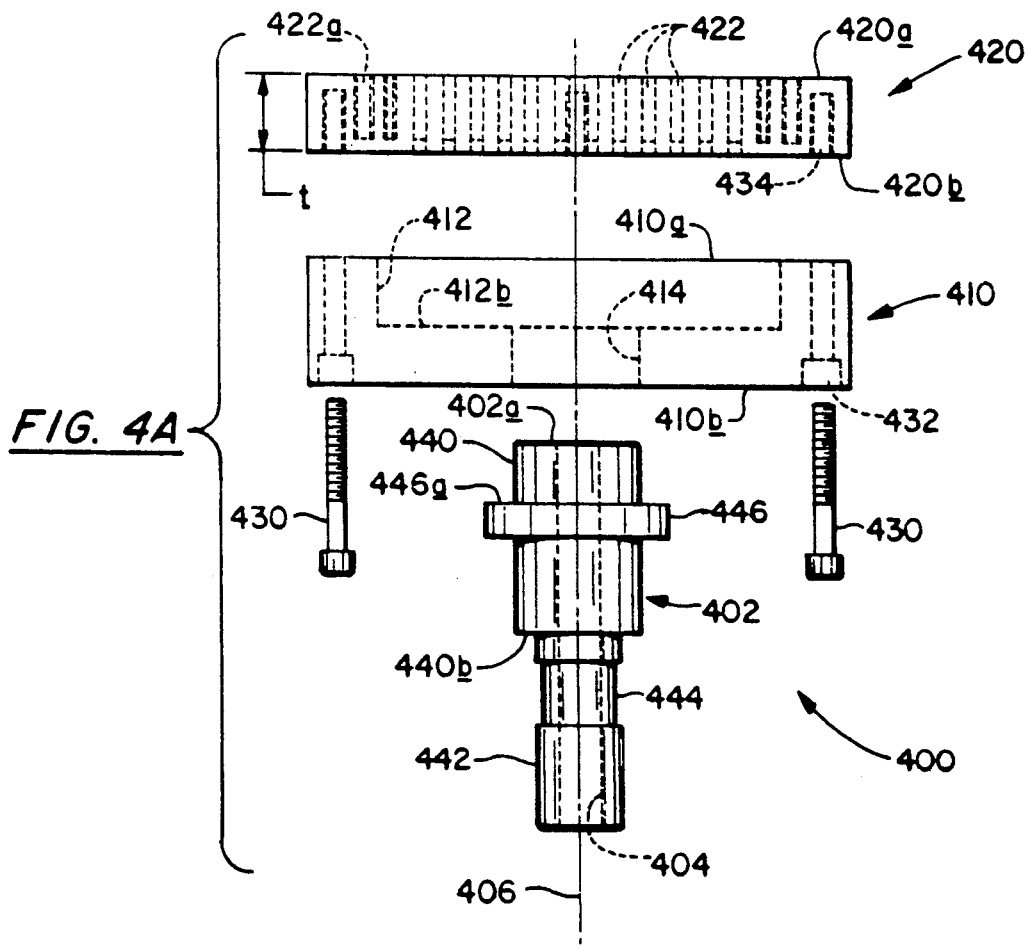
FIG. 4A is an exploded side elevational view of one embodiment of the vacuum pedestal of the present invention.

FIGS. 4A and 4B show the vacuum pedestal technique of the present invention. The pedestal 400 includes a generally cylindrical shaft 402. The overall shape of the shaft is cylindrical, which lends itself well to manufacture on a lathe.

The shaft 402 is provided with an air passageway (through hole) 404 (shown in dashed lines) extending axially entirely through the shaft 402. The axis is indicated at "406".

An upper portion 440 of the shaft 402 is of relatively greater diameter than a lower portion 442 of the shaft.

The shaft is provided with a region 444 of further reduced diameter to provide a set screw relief for mounting the shaft in a cylindrical member (not shown) by means of a set screw (not shown) extending through the cylindrical member and tightened radially against the set screw relief region 444. The lower portion 442 of the shaft is sized to seal within the cylindrical member (not shown), so that vacuum integrity is maintained. Hence, it is acceptable that the set screw mars (gouges) the shaft 402 in the set screw relief region 444, without losing vacuum integrity (airtightness of the shaft within the cylindrical member).

An annular flange 446, of slightly greater diameter than the upper portion 440 of the shaft 402, is provided near the top end 402a of the shaft 402. A top surface 446a of the flange 446 acts as a seating plane for a vacuum reservoir block, discussed hereinbelow. A lower surface 440b of the upper portion 440 acts as a seating plane for the cylindrical member (not shown, discussed hereinabove) receiving the lower portion 442 of the shaft 402.

A vacuum reservoir block 410 is provided, and is essentially a block of aluminum or other suitable airtight material. The block 410 has a rectangular (typically square) top surface 410a and a rectangular (typically square) bottom surface 410b parallel to the top surface 410a. A cavity 412 (shown in dashed lines) is formed in the top surface 410a of the block 410, extending from the top surface 410a approximately halfway to the bottom surface 410b. The cavity 412 is disposed approximately one half inch inside the outer periphery of the block 410, and is sized approximately one-half inch less than the length and width dimensions of a package body containing a die to be bonded in the package. A hole 414 (shown in dashed lines) extends from the bottom surface 412b of the cavity 412, axially, through to the bottom surface 410b of the block, and is sized to receive the top end 402a of the shaft 402, snugly in an air-tight manner (e.g., an interference fit). The shoulder 406 limits insertion of the shaft 402 into the hole 414. The cavity 412 is in airflow communication with the passageway 404.

An alignment/fixture plate 420 is provided, and is essentially a block of aluminum, Delrin (TM) or other suitable air-tight material. The plate 420 has a rectangular (typically square) top surface 420a and a rectangular (typically square) bottom surface 420b parallel to the top surface 420a. The length "l" and width "w" of the plate 420 are substantially equal to those of the block 410, and of a package body containing a die being bonded. The thickness "t" of the plate 420 is preferably greater than the length of the pins (e.g., 106, FIG. 1) extending from the bottom surface of a PGA (e.g., 100, FIG. 1).

In the embodiment of FIGS. 4A and 4B, the plate 420 is fully-populated with holes 422 disposed at positions corresponding to the pins of a fully-populated PGA, for receiving the pins thereof. However, there are preferably three different size holes 422:

A first size hole 422 has a diameter slightly, on the order of 0.020 inch greater than the diameter of a pin 106. The holes 422 are predominantly this size, which allows for easy insertion of a pin 106 into a hole 422.

A second size hole 422a has a larger diameter than the holes 422, and is sized to readily permit insertion of a pin 106a, including the standoff element on the pin 106a. There are only a few of these holes 422a, corresponding to the few standoff pins 106a of the PGA. (FIG. 4B shows one such hole 422a at each corner of the array of holes 422.) Again, the clearance is on the order of 0.020 inch, to allow for easy insertion of the pin 106a into the hole 422a.

A third size hole 422b has a diameter ever so slightly, on the order of 0.005 inch greater than the diameter of a pin 106. There are only a few of these "guide" holes 422b, e.g., one or two at each corner of the plate. (FIG. 4B shows two such holes 422b at each of two opposite corners of the array of holes 422.) These tight-tolerance holes 422b maintain precise alignment of a PGA 100 having its pins inserted into the holes 422 insertion of a pin 106 into a hole 422.

As shown, screws 430 are used to assemble the plate 420 to the block 410. To this end, the block is provided with countersunk holes 432 extending from the bottom surface 410b to the top surface 410a, and threaded holes 434 extend from the bottom surface 420b of the plate partially through the plate. These holes 432 and 434 are aligned with one another, and are disposed at at least the four corners of the plate and block. Preferably, additional holes 432 and 434 are provided midway along the side edges of the plate and block, as best viewed in FIG. 4B.

One caveat with the holes 434 is that they preferably do not intrude upon the area of the pin holes 422 (including 422a and 422b). Otherwise, an air passage would be formed from the bottom surface 420b of the plate through to the top surface 420a, via the holes 434 and the intruded-upon holes 422. One skilled in the art to which this invention most nearly pertains will undoubtedly recognize this design criteria.

A fully-populated PGA (100) inserted (i.e., its pins) into the holes 422 forms a reasonably air-tight seal against the top surface of the plate 420. In a manner functionally somewhat similar to that shown in the vacuum chuck technique of FIG. 3, the passage 404 communicates with a vacuum source (not shown). Upon application of vacuum, the block 410 and holes 422 are evacuated, and ambient air pressure holds the PGA firmly, by its periphery, against the block.

Preferably, the outer rows and columns of holes 422, (designated 422d in FIG. 4A) namely those closest to the periphery of the plate 420, extend only partially through the plate, from the top surface 420a thereof, and the remaining holes 422 (see FIG. 4A) extend completely through the plate 420.

In contrast to the vacuum-chucking technique shown in FIG. 3, peripheral support of the package 102 (i.e., about substantially its entire periphery) has less tendency to distort (bend) the package. Evidently, when using a vacuum chuck, such as is illustrated in FIG. 3, excess pressure on only a central region of the package 102 could cause distortion (bending; non-planarity) of and damage to the package 102. While not likely to be of any usual significance, these bending forces can transmit themselves to the die, and cause a reject part under certain unfavorable circumstances (weak chip package, etc.).

Figure 5:
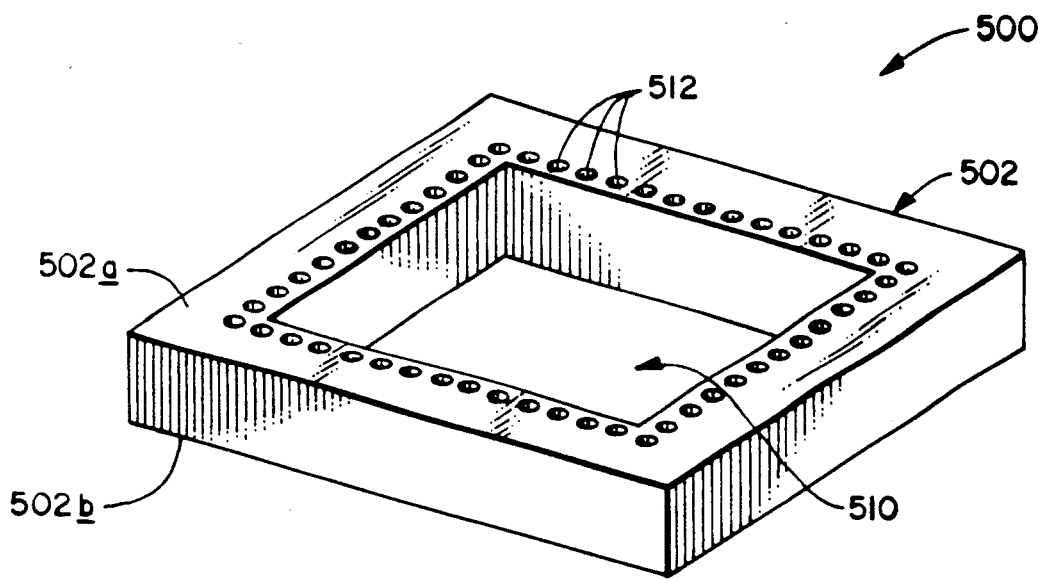
FIG. 5 is a perspective view of an alternate embodiment of the alignment/fixture plate component of the vacuum pedestal of the present invention.

FIG. 5 shows an alternate embodiment 500 of the present invention, and relates primarily to the alignment plate (compare plate 420 of FIG. 4). Herein, rather than provide a plurality of holes 422 equal to the total number of pins 106, only sufficient holes 512 are provided for receiving the one or two (one shown) outermost rows and columns of pins 106. In this case, the plate 502 is definitely thicker than the length of any pin, and the pin-receiving holes 512 extend only partially through the plate 502 from the top surface 502a thereof to the bottom surface 502b thereof. Evidently, the holes 512 must be sufficiently deep to fully receive the pins 106, thereby allowing the package body 102 to rest airtightly upon the upper surface 502a of the plate. In this embodiment, different size holes can be employed (compare holes 422, 422a and 422b of FIG. 4B), for receiving "regular" pins 106, "standoff" pins 106a, and for holding a tight tolerance with some of the pins 106, but these details are omitted from this view for clarity. Two or more rows/columns of holes 512, corresponding to the outermost rows/columns of pins, is also a viable alternative.

Whereas the plate 420 of FIGS. 4A and 4B had a full complement of holes 422, corresponding in number and location to all of the pins on the PGA, in the FIG. 5 embodiment, the plate 500 is provided with holes 512 for only the outer rows and columns of pins. Inasmuch as these holes 512 preferably do not extend through the plate 510, the plate is provided with a large central opening 510 corresponding in size and location to all of the pins (106) that are not received by holes 512. The large central opening 510 allows a vacuum, supplied via the air passageway (e.g., 404 of FIG. 4A) to securely hold the package body against the top surface 502a of the alignment/fixture plate 500.

Evidently, whereas the plate 420 of FIGS. 4A and 4B support substantially the entire undersurface of the package body, the plate 510 of FIG. 5 supports only the periphery of the package body. However, either is preferable to the vacuum chucking technique of FIG. 3 which supports only a small central area on the underside of the package body.

In either embodiment of the invention, a package body is held more securely and more precisely aligned with the pedestal than in the prior art vacuum chuck of FIG. 3, and there is a more even distribution of holding force. And, in either embodiment of the invention, the package is held as securely as with any of the mechanical contraptions discussed hereinabove, but protruding mechanical elements and increased mass is avoided.

For the alignment/fixture plate 420 of FIGS. 4A and 4B, and for the alignment fixture plate 500 of FIG. 5, the use of a plastic material, such as Delrin (TM) is preferred over metal, as avoiding the possibility of gouging or scraping the leads (106). Nylon is also a reasonable choice of material.

What is claimed is:

1. Vacuum pedestal for a wire bonder, comprising:
   a shaft having a top end;
   an air passageway extending through the shaft and exiting the top end of the shaft;
   a block supported on the top end of the shaft, having a top surface and a bottom surface, and having a length and a width;
   a cavity formed in the block, and extending partially through the block from the top surface thereof;
   means for communicating air from the cavity to the air passageway in the shaft;
   a plate having a top surface and a bottom surface, disposed atop the block, having a length and a width substantially equal to the length and width of the block;
   holes extending into the plate from the top surface thereof, said holes sized and located to receive pins of a pin grid array;
   means for communicating air from the top surface of the plate to the cavity, thereby, upon applying a vacuum to the air passageway, tightly holding a pin grid array package against the plate.

2. Vacuum pedestal, according to claim 1, wherein:
   the means for communicating air from the top surface of the block to the cavity is a at least some of the holes extending into the plate.

3. Vacuum pedestal, according to claim 1, wherein:
   the number of holes in the plate corresponds to the number of pins extending from the pin grid array.

4. Vacuum pedestal, according to claim 1, wherein:
   the means for communicating air from the top surface of the block to the cavity is a central opening extending through the plate.

5. Vacuum pedestal, according to claim 1, wherein:
   the pins extending from the pin grid array are arranged in rows and columns; and
   the number and location of holes in the plate corresponds to only the outermost rows and columns of pins extending from the pin grid array.

6. Vacuum pedestal, according to claim 1, wherein:
   a first set of holes have a diameter greater than the diameter of the pins, allowing for easy insertion of the pins into the holes;
   a second set of holes have a diameter, less than the diameter of the first set of holes, allowing for precise location of the pin grid array with respect to the plate.

7. Vacuum pedestal, according to claim 1, wherein:
   the plate is formed of a plastic material.

8. Wire bonding apparatus, for connecting die pads to package terminals, comprising:
   a pedestal supporting a semiconductor package having terminals containing a die having pads;
   wherein the pedestal further comprises:
   a shaft having a top end;
   an air passageway extending through the shaft and exiting the top end of the shaft;
   a block supported on the top end of the shaft, having a top surface and a bottom surface, and having a length and a width;
   a cavity formed in the block, and extending partially through the block from the top surface thereof;
   means for communicating air from the cavity to the air passageway in the shaft;
   a plate having a top surface and a bottom surface, disposed atom the block, having a length and a width substantially equal to the length and width of the block;
   holes extending into the plate from the top surface thereof, said holes sized and located to receive pins of a pin grid array;
   means for communicating air from the top surface of the plate to the cavity, thereby, upon applying a vacuum to the air passageway, tightly holding a pin grid array package against the plate.

* * * * *